United States Patent [19]

Okumura et al.

[11] Patent Number: 5,744,293
[45] Date of Patent: Apr. 28, 1998

[54] SEMICONDUCTOR DEVICE HAVING ANTIREFLECTIVE LAYER CONTAINING ORGANIC RESIN WITH DISPERSED CARBON PARTICLES

[75] Inventors: Katsuya Okumura, Poughkeepsie; Tsuyoshi Shibata, Fishkill, both of N.Y.

[73] Assignee: Kabushiki Kaisha Toshiba, Kanagawa-Ken, Japan

[21] Appl. No.: 821,412

[22] Filed: Mar. 21, 1997

Related U.S. Application Data

[63] Continuation of Ser. No. 377,730, Jan. 25, 1995, abandoned.

[51] Int. Cl.⁶ .................... G03F 7/11; G03C 1/825
[52] U.S. Cl. .................... 430/512; 430/271.1; 430/510
[58] Field of Search .................... 430/302, 311, 430/510, 512, 271.1

[56] References Cited

U.S. PATENT DOCUMENTS

| | | | |
|---|---|---|---|
| 3,884,698 | 5/1975 | Kakihama et al. | |
| 4,179,531 | 12/1979 | Hein et al. | 430/300 |
| 4,234,676 | 11/1980 | Hein et al. | 430/286 |
| 4,412,903 | 11/1983 | Green et al. | 204/192 |
| 4,530,891 | 7/1985 | Nagarekawa et al. | 430/5 |
| 4,563,407 | 1/1986 | Matsui et al. | 430/5 |
| 4,657,648 | 4/1987 | Nagarekawa et al. | 204/192.26 |
| 4,696,877 | 9/1987 | Matsui et al. | 430/5 |
| 4,720,442 | 1/1988 | Shinkai et al. | 430/5 |
| 4,910,122 | 3/1990 | Arnold et al. | 430/313 |
| 4,942,451 | 7/1990 | Tamaki et al. | 357/67 |
| 5,240,554 | 8/1993 | Hori et al. | 156/643 |
| 5,302,240 | 4/1994 | Hori et al. | 156/643 |
| 5,334,486 | 8/1994 | Abe et al. | 430/288 |

FOREIGN PATENT DOCUMENTS

60-240127  11/1985  Japan.

*Primary Examiner*—Christopher G. Young
*Attorney, Agent, or Firm*—Banner & Witcoff, Ltd.

[57] ABSTRACT

This invention relates to an antireflective layer (ARL) which has both good absorption capability and low reflectivity at the photoresist/ARL interface. The ARL also significantly reduces CD variation in exposed photoresist film. The ARL of the present invention comprises an organic base resin having fine carbon particles dispersed therein. The combination of the organic base resin and fine carbon particles provide both good absorption and low reflectivity.

The present invention is also related to a process of forming a semiconductor by applying an antireflection layer to the surface of a substrate, forming a photoresist layer on the antireflection layer, and selectively exposing the substrate to ultraviolet light, wherein the antireflective layer is an organic resin having carbon particles dispersed therein.

6 Claims, 1 Drawing Sheet

SEMICONDUCTOR DEVICE HAVING ANTIREFLECTIVE LAYER CONTAINING ORGANIC RESIN WITH DISPERSED CARBON PARTICLES

This application is a file wrapper continuation of application Ser. No. 08/377,730, filed on Jan. 25, 1995, now abandoned.

This invention relates to an antireflective coating for a semiconductor.

BACKGROUND OF THE INVENTION

In the manufacture of a semiconductor, a layer of photoresist may be applied directly to the surface of a substrate or to layer(s) already on the surface of the substrate. A portion of the photoresist is then exposed to u.v. light to form a pattern on the photoresist. Then a solvent is applied to remove either the exposed or unexposed photoresist as desired.

Light scattering or interference caused by light reflecting off the substrate, for example, causes a dimension change in the exposed region of the photoresist layer. In other words, the desired dimensions of the exposed photoresist layer are altered by the light reflecting off the surface of the substrate. In some semiconductors small variations in the desired dimensions may be acceptable. However, there is usually a point in which no further variation can be tolerated because such variation alters the desired characteristics and performance of the semiconductor. The point at which no further variation can be tolerated is called the critical dimension ("CD").

In order to reduce light scattering from the substrate during exposure to u.v. light, an antireflective layer (ARL) may be applied to the substrate prior to applying the photoresist layer. An ARL is usually spun onto the substrate and baked prior to applying the photoresist layer. After the photoresist layer is applied, a pattern is developed in both the photoresist and the ARL by u.v. light. Then both the desired photoresist and ARL portions are removed.

To be effective, the ARL must have a refractive index which is close to or matches the refractive index of the photoresist layer in order to avoid high reflectivity at the photoresist/ARL layer interface. Organic ARL's, generally formed by spin coating, have refractive indexes close to that of typical photoresists and thus have low reflectivity at the resist/ARL interface.

Conventional organic ARLs generally contain a base resin (polymer) and an organic solvent. Organic ARL polymers include polybutenesulfone, polyimide and polyamide. Typical solvents include cyclohexanone and γ-butyllactone.

However, to be effective, it is also important that the ARL have good light absorption capability. The ARL should be able to absorb the same pattern as the photoresist layer so that the desired pattern is able to be etched on the substrate $SiO_2$ layer. Although the desired photoresist portions may be removed first followed by removal of the ARL in a separate etching step, it is often desired to remove the photoresist and ARL together. In order to remove the photoresist layer and ARL together, the ARL should be able to develop and be stripped by the same chemicals as the photoresist. Known organic ARLs, for example, have poor absorption capability making it difficult to form the same pattern as the photoresist layer and also making it difficult to remove organic ARL with the photoresist from the substrate surface.

Other films have been explored for use as ARLs. Carbon film layers, generally formed by CVD or sputtering, have excellent absorption capability. However, they do not make effective ARLs because the difference between the refractive index of the carbon film and the photoresist is large and thus there is high reflectivity at the interface of the photoresist/carbon layers.

These shortcomings can be demonstrated by an analysis of the optical constants. Optical constants at a light wavelength of 250 nm for photoresist, organic ARL and carbon film are shown below:

|  | η | k |
|---|---|---|
| Resist | 1.69 | −i0.0046 |
| Organic ARL | 1.77 | −i0.234 |
| Carbon Film | 1.428 | −i0.6336 |

η=refractive index, k=extinction coefficient

Reflectivity at the interface at two different media is represented as $$R = \left| \frac{\eta_1 - \eta_2}{\eta_1 + \eta_2} \right|^2$$

R=reflectivity $\eta_1$ and $\eta_2$ are refractive indexes of medium 1 and medium 2, respectively.

The refractive index of the organic ARL is closer to the refractive index of the photoresist than the carbon film; thus an organic ARL-resist interface has a lower reflectivity than a carbon film-resist interface.

None of the prior art ARLs provide both good absorption and low reflectivity. There is a need for ARLs having both good absorption capability and low reflectivity. There is also a need for effective ARLs which improve the CD controllability in lithography processes.

SUMMARY OF THE INVENTION

The present invention is directed to an antireflective layer (ARL) which has both good absorption capability and low reflectivity at the photoresist/ARL interface. The ARL also significantly reduces CD variation in exposed photoresist film.

The present invention is particularly directed to an ARL comprising an organic base resin having fine carbon particles dispersed therein. The combination of the organic base resin and fine carbon particles provides both good absorption and low reflectivity.

The present invention is also directed to a process for producing a semiconductor comprising applying an antireflection layer to a surface of a substrate, forming a photoresist layer on the antireflection layer, and selectively exposing the substrate to ultraviolet light, wherein the antireflective layer comprises an organic resin having carbon particles dispersed therein.

It is to be understood that both the foregoing general description and the following detailed description are exemplary and explanatory only and are not restrictive of the present invention as claimed.

DETAILED DESCRIPTION OF THE INVENTION

The present invention may be used with various combinations of known substrates having various film layers. The ARL may be applied to the substrate or to any desired layer between the substrate and photoresist layer. The ARL may be applied several times to the same substrate if different photoresist applications are used. To simplify the description of the present invention, a process to prepare a simple semiconductor will be discussed. It is to be understood that other processes and layer combinations are within the scope of the present invention. For example, a semiconductor may be prepared with a first photoresist-ARL combination, and after forming the desired oxide pattern and removing the photoresist and ARL strip, a second oxide coating may be formed and a second ARL-photoresist combination formed to form a desired pattern in the second oxide coating.

Figure 1A:
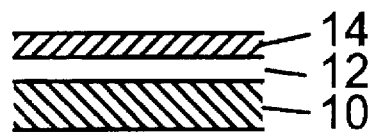
FIG. 1 depicts a preferred embodiment of the process of the present invention.

The present invention will be explained with reference to FIGS. 1A–1F. FIG. 1A illustrates a semiconductor substrate 10 such as silicon having a surface film 12 formed thereon. "Surface film" as used herein will refer to any film or films which have been formed upon the surface of semiconductor substrate 10. Surface film 12 may, for example, be an insulating film such as silicon dioxide or a conductive film such as doped polysilicon. However, the invention is not limited in this respect. Further, although surface film 12 is illustrated as having a planar surface, it may also be non-planar and include one or more step portions.

The substrate may be any conventional substrate suitable for photo-lithography. Examples of suitable substrates include silicon, polysilicon, germanium, nitride, metals and the like.

In order to etch portions of surface film 12 in accordance with the present invention, an antireflective layer 14 is formed. The antireflective layer of the present invention is formed by combining a base resin, an organic solvent and fine carbon particles. Any method of combining the resin, solvent and particles to provide a composition suitable for coating the substrate is contemplated by the inventors. For example, the base resin is first dissolved in the organic solvent, and then the carbon particles are dispersed therein.

The base resin may be any base resin suitable for ARLs including polybutenesulfone, polyimide and polyamide, preferably polybutenesulfone. An amount of resin is used to provide an appropriate ARL on the substrate and is within the skill of the art.

The organic solvent may also be any organic solvent suitable to prepare organic ARLs including cyclohexanone and γ-butyllactone, preferably cyclohexanone. An amount of organic solvent is added to dissolve the resin and disperse the carbon particles and is within the skill of the art.

The fine carbon particles preferably have a particle size of less than 100 Å, preferably less than 10 Å. As a general rule, 10 wt % of carbon is expected to provide 30% enhancement of light absorption capability. Thus to provide enhanced light absorption capability and retain the low reflectivity of the organic resin, the amount of carbon particles dispersed in the resin is about 5 to 30 wt % based on the resin, preferably about 10 wt %. Further, there should be no more than about 10 ppb metal impurities in the carbon powder.

Other additives may be added to the ARL in any manner known to skilled practitioner so long as the desired characteristics of the carbon-dispersed ARL is maintained. For instance, a small amount of surfactant, such as a fluorinated ester, may be added in an amount sufficient to disperse the carbon powder in the resin. An amount sufficient to disperse the carbon particles is within the skill of the art and any amount effective as a surfactant is contemplated.

The ARL preferably has high light absorption capability at the ARL-photoresist interface. The extinction coefficient (k) at a light wavelength of 250 nm should be larger than the key conventional organic ARLs, that is larger than 0.23, and preferably larger than 0.3. The refraction index ($\eta$) at 250 nm should be close to the refraction index of photoresists or between about 1.6 and 1.8, preferably between about 1.7 and 1.8. Variations within the guidelines taught herein of the extinction coefficient and refraction index are within the skill of the art to obtain the desired ARL characteristics.

The ARL of the present invention can be prepared in any appropriate manner. For example, it may be prepared by dispersing fine carbon particles into the organic solvent and then dissolving the appropriate base resin in the carbon dispersed solution. The solution is then stirred by conventional techniques such as in an ultrasonic bath. Other dispersion methods may be used such as a gas evaporation method.

A preferred conventional method for forming an ARL is spin casting, but any coating method known to coat layers on a desired surface in any manner to produce an ARL is contemplated.

Any suitable thickness which provides the desired ARL coating can be used and is within the skill of the art. The thickness of the ARL is preferably less than about 2000 Å, more preferably less than about 1000 Å and most preferably less than 500 Å. Etch bias during ARL etch is minimized by minimizing the thickness of the ARL.

Figure 1B:
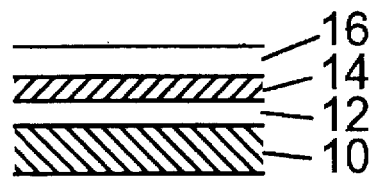
Figure 1C:
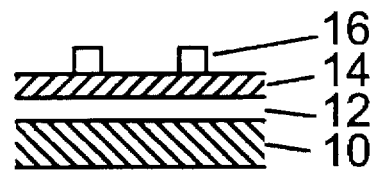

As shown in FIG. 1B, a photoresist layer 16 is then formed on ARL 14. The photoresist may be conventional DUV (deep ultra violet) photoresist such as APEX-E which is a commercially available DUV photoresist sold by IBM. The photoresist is then baked to achieve evaporation of photoresist solvents to promote adhesion. The wafer is then aligned with a mask, exposed, and developed to produce the structure shown in FIG. 1C. Methods to coat, bake, expose and develop photoresist layers are known to skilled practitioners and well within the skill of the art.

Figure 1D:
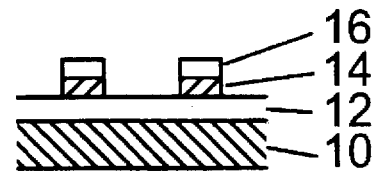

The ARL is then etched in any manner known by skilled artisans to produce the structure of FIG. 1D. The photoresist and ARL may be etched together or separately. A typical, but not limiting, example of an appropriate etching material is a combination of $CF_4$, Ar and $O_2$.

Figure 1E:
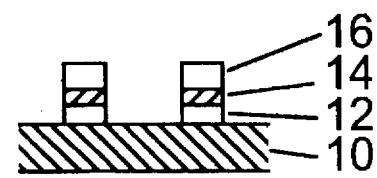
Figure 1F:
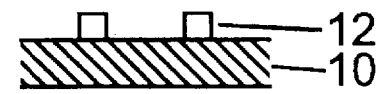

The surface layer is then etched by any conventional technique such as with a combination of $CF_4$ and Ar to produce the structure of FIG. 1E.

The photoresist and ARL strip remaining on the substrate are then removed by conventional techniques known by the skilled artisan, for example by plasma ashing or a wet process using $H_2SO_4$ and $H_2O_2$. The photoresist and ARL strip may be removed together or separately as desired to produce the structure of 1F.

EXAMPLES

The invention will be further described by reference to the following examples. These examples should not be construed in any way as limiting the invention.

The following is a nonlimiting example of preparing an ARL on a semiconductor in accordance with the present invention. Other means of providing an ARL on a semiconductor are within the skill of the art.

An ARL is applied over a silicon dioxide surface of a silicon substrate (10) by a spin coating method at 3000 rpm to a total ARL thickness of 500 Å. A photoresist pattern is printed by conventional lithographic procedures, that is photoresist coat, bake, expose and develop. The ARL is etched, for example, with a combination of $CF_4$, Ar and $O_2$.

Then, the $SiO_2$ is etched, for example with a combination of $CF_4$ and Ar. Finally, the photoresist and ARL strip are stripped by $O_2$ plasma ashing or wet process ($H_2SO_4$ and $H_2O_2$) leaving the $SiO_2$ pattern on the silicon substrate.

A typical ARL composition includes:

1.5–3 wt % of polybutenesulfone resin based on the ARL solution 10 wt % carbon fine powder based on the resin 400 ppm surfactant based on the ARL solution cyclohexanone solvent.

It will be apparent to those skilled in the art that various modifications and variations can be made in the compositions and methods of the present invention without departing from the spirit or scope of the invention. Thus, it is intended that the present invention cover the modifications and variations of this invention provided they come within the scope of the appended claims and their equivalents.

What is claimed is:

1. A semiconductor device prepared with an antireflective layer applied on a substrate and a photoresist layer applied on the antireflective layer, said antireflective layer comprising an organic resin having carbon particles dispersed therein, wherein the antireflective layer has an extinction coefficient larger than 0.23 and a refraction index between about 1.6 and 1.8 at a light wavelength of 250 nm, wherein the carbon particles have a particle size less than 100 Å and the amount of carbon particles dispersed in the resin is about 5 to 30 wt % based on the resin.

2. The semiconductor device of claim 1 wherein the organic resin is formed from a base resin and an amount of an organic solvent sufficient to dissolve the base resin.

3. The semiconductor device of claim 2 wherein the base resin is selected from the group consisting of polybutenesulfone, polyimide and polyamide.

4. The semiconductor device of claim 2 wherein the organic solvent is selected from the group consisting of cyclohexanone and α-butyllactone.

5. The semiconductor device of claim 1 wherein the carbon particles have a particle size of less than 10 Å.

6. The semiconductor device of claim 1 wherein the amount of carbon particles is about 10 wt %.

* * * * *